United States Patent [19]

Larsen et al.

[11] Patent Number: 4,698,522

[45] Date of Patent: Oct. 6, 1987

[54] STRUCTURE FOR HALL DEVICE FOR COMPENSATION OF FIRST AND SECOND ORDER VOLTAGE OFFSETS

[75] Inventors: James W. Larsen, Douglasville; Daniel P. Campbell, Atlanta, both of Ga.

[73] Assignee: Sangamo Weston, Inc., Norcross, Ga.

[21] Appl. No.: 933,444

[22] Filed: Nov. 21, 1986

[51] Int. Cl.$^4$ ............... H03K 17/90; H01L 43/00; G01R 33/06; H03H 1/00

[52] U.S. Cl. ............... 307/309; 357/27; 338/32 H; 323/368; 324/251

[58] Field of Search ............... 307/309; 357/27; 338/32 H; 324/251; 323/368

[56] References Cited

U.S. PATENT DOCUMENTS 3,348,184 10/1967 Halla ............... 338/32 H
4,398,342 8/1983 Pitt et al. ............... 357/27

FOREIGN PATENT DOCUMENTS 0049785 4/1977 Japan ............... 338/32 H
0074661 6/1980 Japan ............... 323/368
0107087 7/1982 Japan ............... 338/32 H

OTHER PUBLICATIONS

Collins et al., "Elimination of DC Offset Potential of Hall Effect Devices", vol. 12, No. 12, May 1970, p. 2163.

Primary Examiner—Stanley D. Miller
Assistant Examiner—Trong Q. Phan
Attorney, Agent, or Firm—Dale Gaudier

[57] ABSTRACT

A Hall device is formed from a generally rectangular body of material exhibiting the Hall effect, with two excitation electrodes disposed along opposite edges of the device. Two Hall output voltage electrodes are disposed along one of the remaining edges of the main body and at least one additional output electrode is disposed on the edge of the main body opposite the first pair of electrodes. At least two of the output electrodes are offset from a centerline drawn through the electrical midpoint of the main body. By deliberately offsetting the Hall voltage output electrodes from the centerline the first and second order voltage offsets due to inhomogeneities of the Hall material and mask misalignment are eliminated or easily compensated.

14 Claims, 4 Drawing Figures

STRUCTURE FOR HALL DEVICE FOR COMPENSATION OF FIRST AND SECOND ORDER VOLTAGE OFFSETS

TECHNICAL FIELD

The invention concerns Hall devices and, more particularly, an improved structure for a Hall device whereby first and second order voltage offsets can be eliminated or readily compensated.

BACKGROUND ART

Devices utilizing the Hall effect have been known for many years. Such devices generally comprise a body formed from a material exhibiting the Hall effect, such as indium antimonide (InSb), indium arsenide (InAs), gallium arsenide (GaAs), or other well known materials. Such devices are formed having a rectangular, square or cross shape. The first pair of electrodes are disposed on opposite edges of the body to which is applied a so-called excitation current or voltage. Generally, two additional electrodes are provided opposite each other on the remaining edges of the body. These electrodes are variously called the output, sensor or Hall voltage electrodes.

As is well known, when a Hall device is inserted into a magnetic field having a component normal to the plane of the body of the material, a voltage will be developed at the output electrodes which is proportional to the excitation current and the magnetic field strength.

Devices exhibiting the Hall effect have found use in many areas, including use as switching devices, magnetic sensors, and as an electrical power sensor. In this latter case, a Hall effect device can be used to measure the power flowing in an electrical circuit, such as is used to supply electricity to a home or office. This is done by applying a excitation voltage to the Hall device which is proportional to the AC line voltage and by coupling one or more of the live power carrying lines to a magnetic circuit associated with the Hall effect device so that the strength of the magnetic field being applied to the Hall device is proportional to the current flowing in the measured live lines. The voltage appearing at the output terminals of the Hall effect device will be directly proportional to the product of the instantaneous line voltage times the instantaneous line current, i.e. power or watts. If this power-representative voltage is applied to a voltage-to-frequency converter the output of the converter will be a series of pulses whose frequency is proportional to power. When these pulses are accumulated over time, e.g. by a counter, the resultant accumulated amount of pulses is representative of energy or watt-hours.

One problem associated with prior Hall effect devices is a condition in which an output appears at the output electrodes of the Hall device even though no external magnetic field is present. Ideally, if no magnetic field were present and the Hall device were perfectly symmetrical, the output of a Hall device at its output electrode would be zero, even when an excitation voltage is applied to the excitation electrodes. However, in practice, because of inhomogeneities in the Hall material, manufacturing tolerances and changes in environmental factors, such as temperature and the like, a non-zero output voltage may be present even in the absence of an applied external magnetic field.

In a D.C. device, voltage offsets due to device asymmetry or materials inhomogeneity can be corrected by offsetting the Hall voltage output electrodes so as to lie along the equipotential line closest to the geometrical center of the device. However, such a solution cannot be used in a device where an A.C. excitation voltage is used, such as would be necessary in measuring electrical power or energy in an electricity meter. This is because the position of the equipotential line constantly shifts as the sign of the applied A.C. voltage changes.

It has been found that the voltage offset encountered in A.C. type Hall devices is really composed of two offsets. One offset is a first order (linear) offset due to inhomogeneities in the material comprising the Hall device. This offset term can be readily compensated for by the use of external balancing resistors connected to the output electrodes of the Hall device. However, the other component of the voltage offset is a second order and non-linear function which is believed to be caused by alignment errors in the fabrication of the Hall device. Such alignment errors cause the Hall device to be formed having a somewhat asymmetrical shape. Other causes of this second order offset voltage are also believed to include back-gating and self-gating effects due to electron tunneling in the material as well as non uniformity in the material.

This second order voltage offset cannot be readily corrected using external balancing resistors as can the first order offset term. The presence of this second order voltage offset term in currently available Hall devices makes them unsuitable for use in the measurement of electrical power (e.g. as a power sensor for an electricity meter) because of the high accuracy (e.g. $\pm \frac{1}{2}$ percent of measurement) required over the entire measuring range encountered by such devices. Since electricity meters must be capable of accurately measuring power over values ranging from fractions of a watt up to tens of thousands of watts, there is a strong need for a Hall effect device which will provide the necessary accuracy so that such devices can be used as solid state power sensors.

DISCLOSURE OF THE INVENTION

The foregoing drawbacks of prior Hall effect devices are overcome by the improved structure for a Hall device of the present invention. The Hall device comprises a main body formed from a material exhibiting the Hall effect and at least a pair of excitation electrodes disposed along opposing edges of the main body for receiving an excitation voltage (e.g. an A.C. voltage). At least a first pair of Hall voltage output electrodes are disposed along one of the remaining edges of the main body and at least one additional output electrode is disposed along the edge of the main body opposite the first pair of output electrodes. A key feature of the present invention is that the output electrodes are arranged such that a line drawn equidistant between the pair of output electrodes and transverse to a line between the excitation electrodes is offset from a centerline drawn through the electrical midpoint of the main body and perpendicular to the line joining the excitation electrodes. The electrical midpoint is the point between the excitation electrodes where is measured exactly one-half of the voltage applied between the excitation electrodes. Where a symmetrical (e.g. rectangular) geometry is employed in the main body, the electrical midpoint will generally correspond to the geometrical center of the main body.

It has been found that at least the first pair of output electrodes should be arranged such that the line between them is offset from the centerline by an amount greater than or equal to the largest expected error which might occur in the placement of the output electrodes during fabrication of the Hall device. This is done to ensure that at least two of the output electrodes will not lie on the centerline.

With the foregoing arrangement, any second order offset voltage, due to alignment errors in fabrication of the output electrodes, is readily corrected. This is because the offset voltage caused by misalignment of one electrode can be cancelled by resistively bridging the other pair of output electrodes and selecting a point between the output electrode pair which electrically is of equal magnitude and opposite sign to the offset caused by the other electrode.

Further, although a first order offset voltage may be present, it can be readily compensated for by applying at least one balancing resistor in a well known manner. Thus, the present invention achieves the elimination of the second order voltage offset term by deliberately introducing asymmetry to the geometry of the electrode structure of the Hall device.

Although one of the electrodes can be disposed along the centerline, it is also possible for all the output electrodes to be offset from the centerline.

In one embodiment of the invention, there are two pairs of output electrodes disposed along opposite edges of the main body which is formed having a generally rectangular shape. These pairs of output electrodes may have their respective centerlines offset with respect to each other or disposed directly opposite each other. One electrode of each opposite pair can be disposed along the centerline of the body.

The electrodes can be so-called "point contact" electrodes or, preferably, formed as rectangular arms integral with the main body and disposed at right angles thereto.

BRIEF DESCRIPTION OF THE DRAWINGS

These and other features and advantages of the present invention will be described with respect to the following detailed description of the best modes of carrying out the invention, when taken in conjunction with the accompanying drawings wherein.

BEST MODES FOR CARRYING OUT THE INVENTION

Figure 1:
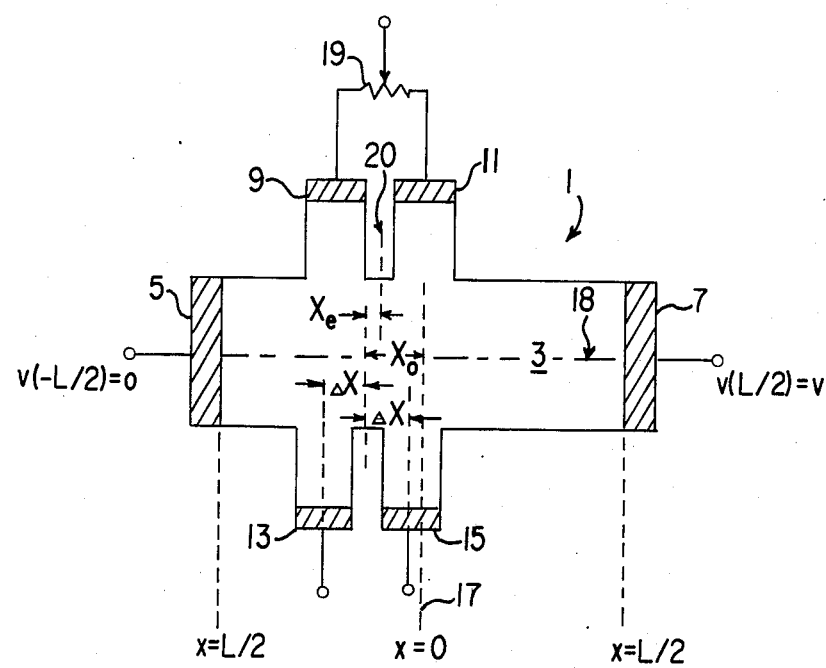
FIG. 1 shows a first embodiment of a Hall device constructed in accordance with the principles of the present invention.

Ideally, a Hall device should have an output which is linear with respect to the input current, i, and the normal component of the magnetic field, B. The proportionality constant should also be independent of temperature, that is $$v_H(t) = \frac{R_H}{d} i(t) B(t) \tag{1}$$

where $R_H$ is the Hall constant, d is the thickness of the plate making up the Hall device, and t is time.

In the case of a rectangular Hall device, equation 1 holds only if the length-to-width ratio of the sides of the device is infinite and perfect symmetry is maintained as well as constant and uniform temperature. The device material must further be entirely homogeneous. In a real Hall generator, these conditions can never be completely obtained, therefore, $v_H(t)$ is actually given by:

$$v_H(t) = \frac{R_H}{d} i(t) B(t) [1 + \epsilon] + P \tag{2}$$

Where $\epsilon$ is a function of the device geometry, the device temperature, and the "Hall angle" $\phi(B)$, i.e. the angle between the electric field and the current, and where P is a function of device geometry, the type of material, the input current, and the normal component B of the magnetic field.

The function $1+\epsilon$ has been evaluated by J. Haeusler and H. J. Lippmann (see *Solid State Electronics,* Vol. 11, p. 173, 1968). For a rectangular Hall generator at constant temperature:

$$1 + \epsilon (L, W, S, \phi) = \tag{3}$$

$$\left[ 1 - \exp\left\{ \left( \frac{-L}{2W} \right) \left( \frac{\phi}{\tan\phi} \right) \right\} \right] \left[ 1 - \frac{2S}{\pi W} \frac{\phi}{\tan\phi} \right]$$

Where a L is the device length, W is the device width, and S in the length of the Hall electrodes.

The $1+\epsilon$ function has been evaluated for several different geometries, such as rectangular and cross-shaped Hall devices. It has been found experimentally that the cross-shaped geometry has a better field linearity than does a purely rectangular device.

In both cases, it has been the practice in the prior art to fabricate Hall devices intended for A.C. excitation, with perfect symmetry reflected about the line which passes through the center of the two Hall electrodes. If perfect geometric symmetry could be obtained, that is, no fabrication misalignment errors were present, as well as perfect material homogeneity, then the value of the function P would be zero. However, such perfection does not occur in reality and therefore the function P is non-zero.

When B is equal to zero, the Hall voltage $v_H$ reduces to the value of P evaluated at B=0. These values are known as the zero field offsets and are very significant to the proper behavior of Hall generators in many applications.

For devices where there exists non-perfect geometry but homogeneous conductivity of the active region of the Hall generator, that is, where the function $\rho(x)=\rho_0$, where $\rho(x)$ is the resistivity per unit length, in the absence of a magnetic field, the voltage at any point x, $v(x)$, is given by:

$$v(x) = \left[ \frac{\int_{-L/2}^{x} \rho_0 dx}{\int_{-L/2}^{L/2} \rho_0 dx} \right] V = \left( 1/2 + \frac{x}{L} \right) V \tag{4}$$

Thus $V_1$ and $V_2$, which are the voltages $v(X_1)$ and $v(X_2)$ taken at points $X_1$ and $X_2$, respectively, are given by:

$$V_1 = (\tfrac{1}{2} + X_1/L)V \qquad (5)$$

$$V_2 = (\tfrac{1}{2} + X_2/L)V \qquad (6)$$

The Hall voltage, $v_H$, at zero field (B=0) is equal to $V_2-V_1$, thus:

$$v_H = V(X_2 - X_1)L = X_e \rho_0 I \qquad (7)$$

Where $X_e$ is the misalignment between output electrodes and where I is the current.

Equation 7 leads to the standard approximation for P when B=0, $P_0$, as follows:

$$P_0 = X_e \rho_0 I \qquad (8)$$

This offset voltage, $P_0$, is linear for applied values of current I (or voltage V).

Several methods for eliminating this offset voltage are known, including the use of external potentiometers to balance the output of the Hall device, the use of multiple electrodes and trimming of the Hall electrodes to reduce $X_e$.

In practice the Hall electrodes are not point electrodes, but extended electrodes. However, the offset is still approximately linear for I or V.

In the past, attempts have been made to reduce or eliminate this first order offset voltage by making the Hall device more symmetrical and reducing electrode alignment errors. In another approach, some prior art devices have attempted to eliminate this voltage offset term by offsetting opposing Hall voltage output electrodes in opposing directions from the centerline of these devices. This is done in order to make the output electrodes align more precisely on an equipotential line of the current being induced between these two output electrodes.

However, while various attempts have been made to overcome this first order or linear voltage offset in Hall devices, in a real Hall device $\rho(x)$ is not constant. This is especially true in the case of thin-film type Hall devices. In this case $\rho(x)$ varies due to effects like self-gating, back-gating, substrate bias and non-uniform doping of the active region. Epitaxial thin-film Hall devices are very useful because of their high sensitivity and low cost. For a device where $\rho(x)$ is not constant, $P_0$ contains higher order terms, that is:

$$P_0 = K_0 + K_1 i + K_2 i^2 + K_3 i^3 \qquad (9)$$

For commonly available devices, such as those made from indium arsenide (InAs) or gallium arsenide (GaAs), the terms $K_1$ and $K_2$ are the most significant with the other components being at least an order of magnitude smaller. Since the terms $K_0$ and $K_1 i$ are linear, their effects may be readily compensated for by the use of external balancing resistors applied to the outputs of the Hall device. However, the $K_2 i^2$ term is non-linear and cannot be compensated for in this fashion.

Turning now to FIG. 1, there is shown a geometry for a Hall device constructed in accordance with the principles of the present invention which eliminates this nonlinear second order voltage offset term ($K_2 i^2$).

Surprisingly, the elimination of this second order term comes about by deliberately fabricating the Hall device with a carefully designed asymmetrical shape.

Hall device 1 comprises a generally rectangular body 3 of material exhibiting the Hall effect. Such materials are well known, and they comprise, for example, a thin film of gallium arsenide, formed as shown in U.S. Pat. No. 4,398,342.

Hall device 1 includes a pair of excitation electrodes 5 and 7 which are connected to a source of electrical voltage and current (not shown) for powering Hall device 1.

Hall device 1 further includes a first pair of output electrodes 9 and 11 disposed on one of the remaining sides of body 3 and a second pair of output electrodes 13 and 15 disposed on the side of body 3 opposite that of the first pair of output electrodes 9 and 11.

Also shown in FIG. 1 is the centerline 17 which lies electrically midway between the ends of body 3 to which excitation electrodes 5 and 7 are applied. Centerline 17 is also designated as the origin (x=0) for measurements of displacement of the electrodes from the centerline, as discussed below. More particularly, centerline 17 corresponds to a line drawn perpendicular to a line 18 drawn between excitation electrodes 5 and 7 and through a point of main body 3 where one-half the voltage applied to excitation electrodes 5 and 7 is measured. For a device having a symmetrical geometry (e.g. rectangular) the electrical midpoint will usually correspond to the geometrical center of body 3.

As shown in FIG. 1, of the four output electrodes 9, 11, 13 and 15, only electrode 11 is centered on the centerline 17. While electrodes of each pair 9, 11 and 13, 15 are spaced apart with respect to each other by the same distance (i.e. $2\Delta X$), the opposing pairs of output electrodes 9, 11, and 13, 15 are deliberately or unintentionally offset from each other by an amount $X_e$. Also, at least one pair of output electrodes (e.g. electrodes 9, 11 or 13, 15) are arranged such that a line 20 drawn equidistant between a pair of output electrodes and perpendicular to line 18 is deliberately offset from the centerline 17 by an offset distance $X_0$.

It has been theoretically predicted and experimentally found that the arrangement shown in FIG. 1 enables the second order ($K_2 i^2$) Hall voltage output term to be completely eliminated through the simple addition of a balancing resistor 19 applied across one of the pairs of output electrodes (e.g. output electrodes 9 and 11). By offsetting the output electrodes a distance $X_0$ from the centerline 17 of the device, voltages appear at output electrodes 9, 11 and 13, 15 which can be proportionally added using trimming resistor 19 to eliminate the second order voltage offset term.

More particularly, for a Hall device at a given temperature, T, and an applied excitation voltage V, the conductivity of the device is not necessarily constant. The resistance per unit length $\rho(x)$ is therefore a function of the position, x, T and V. v(x) is the voltage at a position x along the Hall device. The value of v where the Hall output voltage is taken is $v_H$. The resistance per unit length, $\rho(x)$, can be expressed by a Taylor's expansion about x=0 (the centerline 17) as follows:

$$\rho(x,T,V) = \rho_0(T,V) + \rho_1(T,V)x + \rho_2(T,V)x^2 + \qquad (10)$$

where:

$$\rho_i(T, V) = \left(\frac{1}{i!}\right) \frac{\partial^i \rho(x, T, V)}{\partial x^i}, \text{ evaluated at } x = 0$$

Simplifying, $$\rho(x, T, V) = \sum_{i=0}^{\infty} \rho_i(T, V) x^i \quad (11)$$

For a device of length L let $x=0$ lie along centerline 17 of device 3. If excitation electrode 5 is grounded so that $v(-L/2)=0$ and a potential V is applied to the other excitation electrode 7, i.e. $v(L/2)=V$, the voltage at any point x is then given by:

$$v(x) = \left[\frac{\int_{-L/2}^{x} \rho(x) dx}{\int_{-L/2}^{L/2} \rho(x) dx}\right] V \quad (12)$$

By substitution of equation 11, equation 12 becomes:

$$v(x) = \left[\frac{\sum_{i=0}^{\infty} \frac{\rho_i(T, V)}{i+1} [x^{i+1} - (-L/2)^{i+1}]}{\sum_{i=0}^{\infty} \frac{\rho_i(T, V)}{i+1} [(-L/2)^{i+1} - (-L/2)^{i+1}]}\right] \quad (13)$$

The linear approximation to $\rho(x)$ is a good first order approximation in the case of back-gating, self-gating, and non-uniform doping over a small sized device. Using the linear approximation, v(x) becomes:

$$v(x) = \frac{\rho_0(T,V)[x + L/2] + (\tfrac{1}{2})\rho_1(T,V)[x^2 - (L/2)^2]}{L\rho_0(T,V)} \quad (14)$$

The functions $\rho_i(T,V)$ can also be expanded about $v=0$ using a Taylor's expansion giving:

$$\rho_0(T, V) = \sum_{j=0}^{\infty} \rho_{0j}(T) V^j \quad (15)$$

and $$\rho_1(T, V) = \sum_{j=0}^{\infty} \rho_{1j}(T) V^j \quad (16)$$

where $$\rho_{ij}(T) = \left(\frac{1}{j!}\right) \left(\frac{\partial^j \rho_i(T, v)}{\partial v^j}\right) \text{ Evaluated at } v = 0$$

Substituting equations 15 into 16 and equation 14 gives:

$$v(X) = \frac{\sum_{j=0}^{\infty} \{\rho_{0j}(T) [x + L/2] + (1/2)\rho_{ij}(T) [x^2 - (L/2)^2]\} V^{j+1}}{R_0(T, V)} \quad (17)$$

where $R_0(T,V) = L\rho_0(T,V)$. Rearranging these terms yields:

$$v(x) = \frac{[x + L/2] V}{L} + \frac{(1/2)\rho_{10}(T) [x^2 - (L/2)^2] V}{R_0(T, V)} + \quad (18)$$

$$\frac{(1/2)\rho_{11}(T) [x^2 - (L/2)^2] V^2}{R_0(T, V)} + \frac{\sum_{j=2}^{\infty} (1/2)\rho_{1j} [x^2 - (L/2)^2] V^{j+1}}{R_0(T, V)}$$

The V and $V^2$ terms are of primary interest in Hall device applications. Therefore $v_2(x)$ is defined as follows:

$$v_2(x) = \frac{[x + L/2] V}{L} + \frac{(\tfrac{1}{2})\rho_{10}(T) [x^2 - (L/2)^2] V}{R_0(T,V)} + \quad (19)$$

$$\frac{(\tfrac{1}{2})\rho_{11}(T) [x^2 - (L/2)^2] V^2}{R_0(T,V)}$$

For a standard Hall device having a rectangular body and point-contact type output electrodes the offset voltage $V_E$ will be:

$$V_E = v_2(X_2) - v_2(X_1) = \frac{X_E V}{L} + \quad (20)$$

$$\frac{(\tfrac{1}{2})\rho_{10}(T) [2X_1 X_c + X_c^2] V}{R_0(T,V)} +$$

$$\frac{(\tfrac{1}{2})\rho_{11}(T) [2X_1 X_c + X_c^2] V^2}{R_0(T,V)}$$

The first term, $X_E V/L$, represents the linear offset voltage due to electrode placement error. The second term is the linear offset due to material inhomogeneity. If the material is homogenous, i.e. $\rho(x)=K(T,V)$ then $\rho_{10}(T)=0$, this term would vanish. The final term is the second order offset which cannot be eliminated easily by prior designs.

Figure 2:
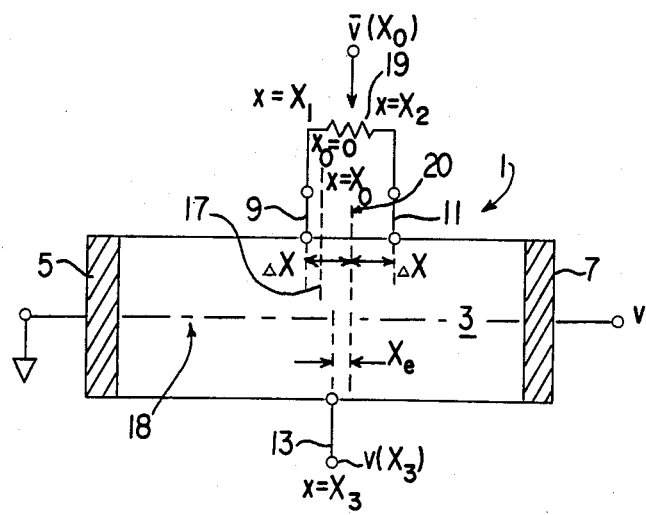
FIG. 2 shows a second embodiment of the present invention having three output electrodes.

FIG. 2 shows an alternative version of the device shown in FIG. 1. Similar reference numerals indicate similar parts of the devices shown in each of the drawing figures. As shown in FIG. 2, output electrodes 9 and 11 are disposed along one side of body 3 and arranged such that line 20, drawn equidistant between electrodes 9 and 11, is offset from centerline 17. Output electrode 13 is disposed on the opposite side of body 3 from output electrode pair 9, 11 and is also offset with respect to centerline 17. Output electrode 15 is omitted.

Assuming that $R_1$ is much greater in value than $R_0(T,V)$ then $$\bar{v}(X_0) = Av_2(X_1) + Bv_2(X_2) \quad (21)$$

where $A+B=1$ and $0 \leq A, B \leq 1$. In this case $V_E$ becomes:

$$V_E = \bar{v}(X_0) - v_2(X_3) \quad (22)$$

thus $$V_E = \frac{[-A\Delta X + B\Delta X - X_c] V}{L} + \quad (23)$$

$$\frac{(\tfrac{1}{2})\rho_{10}(T) [-2AX_0\Delta X + 2BX_0\Delta X - 2X_0 X_c + \Delta X^2 - X_c^2] V}{R_0(T,V)} +$$

-continued
$$\frac{(\frac{1}{2})p_{11}(T)\left[-2AX_0\Delta X + 2BX_0\Delta X - 2X_0X_c + \Delta X^2 - X_c^2\right]V^2}{R_0(T,V)}$$

If $[-2AX_0\Delta X+2BX_0\Delta X-2X_0X_c+\Delta X_c^2]=0$ then the $V^2$ term vanishes. Setting this term equal to zero and substituting $B=1-A$, the following equation is obtained:

$$4AX_0\Delta X=2X_0\Delta X+\Delta X^2-2X_0X_c-X_c^2 \quad (24)$$

This gives:

$$A = 1/2\left[\frac{1+\Delta X^2 - 2X_0X_c - X_c^2}{2X_0\Delta X}\right] \quad (25)$$

and $$B = 1/2\left[\frac{1-\Delta X^2 - 2X_0X_c - X_c^2}{2X_0\Delta X}\right] \quad (26)$$

Therefore, $V_E$ becomes:

$$V_E = \frac{[-A\Delta X + B\Delta X - X_c]V}{L} \quad (27)$$

Which has only a linear component in V. Substituting equations 25 and 26 into equation 27 gives:

$$V_E = \frac{-\left[\frac{\Delta X^2 - 2X_0X_c - X_c^2}{2X_0} + X_c\right]V}{L} \quad (28)$$

and $$V_E = \frac{\left[\frac{X_c^2 - \Delta X^2}{2X_0}\right]V}{L} \quad (29)$$

In order that the linear geometric offset does not increase $$\left|\frac{X_c^2 - \Delta X^2}{2X_0}\right| < |X_c| \quad (30)$$

The restrictions on A and B dictate that $$\left|\frac{\Delta X^2 - 2X_0X_c - X_c^2}{2X_0\Delta X}\right| < 1 \quad (31)$$

This implies that $X_0>\Delta X/2$ in order to insure that equation 31 is always satisfied.

Thus, $$|\Delta X^2 - 2X_0X_c - X_c^2| < |2X_0\Delta X| \quad (32)$$

Equation 32 will hold if:

$$|\Delta X^2 - X_c^2| + |2X_0X_c| < |2X_0\Delta X| \quad (33)$$

From equation 30 it follows that:

$$|\Delta X^2 - X_c^2| < |2X_0X_c| \quad (34)$$

Thus if $$4|X_0X_c| < |2X_0\Delta X| \quad (35)$$

Which gives:

$$|\Delta X| > |2X_c| \quad (36)$$

holds then equation 31 holds, if equation 30 is satisfied.

Since the absolute value of $X_c$ is much smaller than the absolute value of $\Delta X$, if $\Delta X^2 < |2X_0X_c|$, equation 30 is satisfied.

Therefore if:

$$|\Delta X| > |2X_c| \quad (37)$$

and $$\Delta X^2 < |2X_0X_c|$$

then the linear error is smaller than the error for a two electrode device. This also implies that $$|X_0| > |\Delta X| > |X_c|$$

In order to insure that $V^2$ term can be eliminated. Furthermore, since the terms for A and B are independent of V and T, the $V^2$ vanishes for all voltages and temperatures.

It would be desirable if $X_0$ could be kept small. However, the electrode device shown in FIG. 2 requires it be greater than $\Delta X$ which would make an extremely long Hall device necessary in order to preserve the linearity of the device with respect to the magnetic field.

Figure 3:
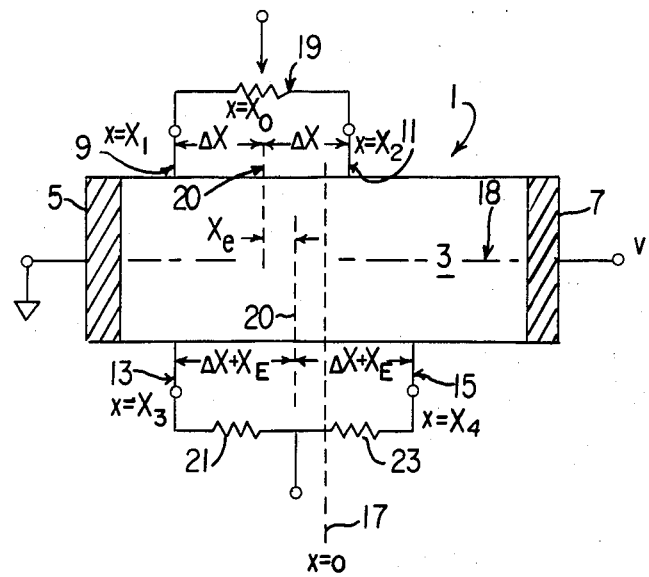
FIG. 3 shows yet another embodiment of the present invention having four output electrodes.

A four electrode device, such as shown in FIG. 3, overcomes this drawback. In order to simplify balancing of the output of the arrangement shown in FIG. 3, balancing resistors 21 and 23 may be connected in series between one of the pairs of output electrodes (e.g. 13 and 15) in a bridge arrangement. With the illustrated arrangement $V_E$ becomes:

$$V_E = Av_2(X_1) + Bv_2(X_2) - (\tfrac{1}{2})v_2(X_3) - (\tfrac{1}{2})v_2(X_4) \quad (38)$$

with:
$X_1 = X_0 - \Delta X$
$X_2 = X_0 + \Delta X$
$X_3 = X_0 + X_e - \Delta X - X_E$
$X_4 = X_0 + X_e + \Delta X + X_E$ Thus, $$V_E = \frac{[-A\Delta X + B\Delta X - X_c]V}{L} + \quad (39)$$

$$\frac{(\tfrac{1}{2})p_{10}(T)[-2AX_0\Delta X + 2BX_0\Delta X - X_c^2 - X_E^2 - 2X_0X_c - 2\Delta XX_E]V}{R_0(T,V)} +$$

$$\frac{(\frac{1}{2})\rho_{11}(T)[-2AX_0\Delta X + 2BX_0\Delta X - X_c^2 - X_E^2 - 2X_0X_c - 2\Delta XX_c]V^2}{R_0(T,V)}$$

If $[-2AX_0\Delta X + 2BX_0\Delta X - X_c^2 - X_E^2 - 2X_0X_c - 2\Delta XX_E] = 0$ then the $V^2$ term vanishes. Setting this term equal to zero and substituting $B = 1 - A$ the following equation is obtained:

$$4AX_0\Delta X = 2X_0\Delta X - X_c^2 - X_E^2 - 2X_0X_c - 2\Delta XX_E \quad (40)$$

Thus:

$$A = (1/2)\left[\frac{2X_0X_c + 2\Delta XX_E + X_c^2 + X_E^2}{2X_0\Delta X}\right] \quad (41)$$

and $$B = (1/2)\left[1 + \frac{2X_0X_c + 2\Delta XX_E + X_c^2 + X_E^2}{2X_0\Delta X}\right] \quad (42)$$

If A and B are thus chosen, the $V^2$ term vanishes and, $V_E$ becomes:

$$V_E = \frac{[-A\Delta X + B\Delta X - X_c]V}{L} \quad (43)$$

Substituting Equations 40 and 41 into Equation 43:

$$V_E = \frac{\left[\frac{2X_0X_c + 2\Delta XX_E + X_c^2 + X_E^2 - X_c}{2X_0}\right]V}{L} \quad (44)$$

and $$V_E = \frac{\left[\frac{2\Delta XX_E + X_c^2 + X_E^2}{2X_0}\right]V}{L} \quad (45)$$

In order that the linear geometric offset does not increase:

$$\left|\frac{2\Delta XX_E + X_c^2 + X_E^2}{2X_0}\right| < |X_c| \quad (46)$$

The limits on A and B specify that:

$$\left|\frac{2X_0X_c + 2\Delta XX_E + X_c^2 + X_E^2}{2X_0\Delta X}\right| < 1 \quad (47)$$

This implies that $X_0 > \max(|X_e|, |X_E|)$ in order that Equation 47 be satisfied. If $|X_0| >> \max(|X_e|, |X_E|)$ and $|\Delta X| >> \max(|X_e|, |X_E|)$ then $$\left|\frac{2X_0X_c + 2\Delta XX_E + X_c^2 + X_E^2}{2X_0\Delta X}\right| \to 0$$

and $A = B = 1/2$ then $$V_E \approx \left(\frac{\Delta X}{X_0}\right)\left(\frac{X_E V}{L}\right)$$

Also, if $X_0 = \Delta X$, then the linear geometric offset, $V_E$ is given by:

$$V_E = \frac{X_E V}{L} \quad (49)$$

which has the same value range as a two electrode Hall device.

In the cases of both the three and four electrode devices (FIGS. 1-3) the terms used to establish the values of A and B in order to eliminate the $V^2$ coefficient are dependent upon device geometry only and essentially independent of applied voltage and temperature. This means that the $V^2$ terms will vanish for all voltages and temperatures. As is apparent from the foregoing, $X_0$ must be intentionally set to be greater in magnitude than the maximum magnitude of the two geometrical errors $X_e$ and $X_E$. It is therefore an important feature of the present invention that the split pairs of electrodes 9, 11 and 13, 15 are arranged such that equidistant line 20, drawn between each electrode pair, is intentionally offset from the centerline 17 of the Hall device by a value whose magnitude is greater than or equal to the largest error which might be expected to occur in the placement of these output electrodes.

The foregoing mathematical analysis of the invention has been made considering the output electrodes to be point-type electrodes placed along the edges of rectangular body 3 of the Hall device. Where other Hall device shapes or Hall output electrodes of more substantial area are involved the analysis is somewhat more complex. However, a substantial reduction and/or elimination of the second order voltage offset term will still occur if the principles set forth above are followed.

Figure 4:
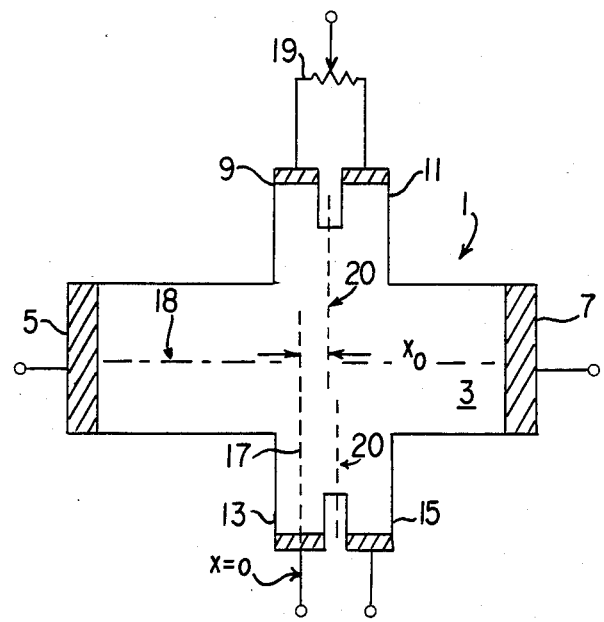
FIG. 4 shows an alternative embodiment of the Hall device shown in FIG. 1.

FIG. 4 shows a Hall device similar to that shown in FIG. 1 which is a good approximation to the ideal case. In FIG. 4 split electrodes pairs 9, 11 and 13, 15 are disposed on opposite sides of rectangular body 3 and aligned diametrically opposite each other, with one electrode of each pair (e.g. electrodes 9 and 13) being centered along centerline 17.

While the invention has been described with respect to the foregoing embodiments, it will be understood that various modifications may be made without departing from the spirit and scope of the invention as defined by the appended claims.

Thus, output electrodes 9, 11 and 13, 15 may be of the point-contact type or, as shown in FIG. 1, formed as arms having a generally rectangular shape disposed at right angles to body 3 and integral with the body. Also, it is not necessary that the Hall device has a rectangular shape. For example, rather than a rectangular shape, a rhombic or parallelpiped shape can be used to effectively alter the geometrical and electrical center of the device with respect to the excitation electrode and output electrodes. An offset can also be achieved by arranging the placement of the excitation electrodes so as to offset the electrical center of the device with respect to the excitation electrodes and output electrodes. Thus, the principles of the present invention can be applied to other Hall device geometries.

We claim:

1. A structure for a Hall device comprising:
   a main body formed from a material exhibiting the Hall effect;
   at least a pair of excitation electrodes disposed on opposing portions of the main body for receiving an excitation voltage or current; and
   Hall voltage output electrodes comprising at least a first pair of output electrodes disposed along one of the remaining sides of the main body, said output electrodes being equally spaced from a line drawn between the output electrodes and transverse to a line drawn through the excitation electrodes, and at least one additional output electrode disposed on a portion of the main body opposite the first pair of output electrodes,
   wherein at least said first pair of output electrodes are arranged such that said line drawn between the pair is offset from a centerline drawn transverse to the line between the excitation electrodes and through the electrical midpoint of the main body.

2. The Hall device of claim 1 wherein at least two of the output electrodes are offset from the centerline by an amount greater than or equal to the largest expected error which might occur in the placement of the output electrodes.

3. The Hall device of claim 1 wherein each of the output electrodes is offset from said centerline.

4. The Hall device of claim 1 wherein there are two pairs of output electrodes, a first pair being disposed along one of the remaining portions of the body and a second pair disposed along the side of the body opposite the first pair of output electrodes.

5. The Hall device of claim 4 wherein a line drawn equidistant between the first pair of output electrodes is offset with respect to a line drawn equidistant between the second pair of output electrodes.

6. The Hall device of claim 5 wherein one of the output electrodes of the first pair is centered along the centerline.

7. The Hall device of claim 4 wherein the first pair of output electrodes is disposed directly opposite the second pair of output electrodes.

8. The Hall device of claim 7 wherein one output electrode of each of the pairs is centered along the centerline.

9. The Hall device of claim 1 wherein at least one balancing resistor is electrically connected between the first pair of output electrodes.

10. The Hall device of claim 4 wherein at least first and second balancing resistors are electrically connected between the first and second pairs of output electrodes, respectively.

11. The Hall device of claim 1 wherein the electrical midpoint of the main body coincides with the geometrical center of the main body.

12. The Hall device of claim 1 wherein the main body has at least a portion formed having a generally rectangular shape.

13. The Hall device of claim 12 wherein each of the output electrodes comprises a generally rectangular arm formed integral with the main body and disposed at right angles thereto.

14. The Hall device of claim 1 wherein the excitation voltage is an alternating current (AC) voltage.

* * * * *